(12) United States Patent
Yorita

(10) Patent No.: US 9,281,822 B2
(45) Date of Patent: Mar. 8, 2016

(54) OSCILLATOR

(71) Applicant: NIHON DEMPA KOGYO CO., LTD., Tokyo (JP)

(72) Inventor: Tomoya Yorita, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 14/485,812

(22) Filed: Sep. 15, 2014

(65) Prior Publication Data

US 2015/0077189 A1 Mar. 19, 2015

(30) Foreign Application Priority Data

Sep. 18, 2013 (JP) ................................. 2013-193051

(51) Int. Cl.
| | |
|---|---|
| *H03B 5/32* | (2006.01) |
| *H03L 1/02* | (2006.01) |
| *H03L 7/06* | (2006.01) |
| *H03L 7/14* | (2006.01) |
| *H03L 7/099* | (2006.01) |
| *H03L 7/10* | (2006.01) |

(52) U.S. Cl.
CPC .. *H03L 1/02* (2013.01); *H03B 5/32* (2013.01); *H03L 1/026* (2013.01); *H03L 7/099* (2013.01); *H03L 7/0991* (2013.01); *H03L 7/104* (2013.01); *H03L 7/145* (2013.01)

(58) Field of Classification Search
CPC .............. H03B 5/30; H03B 5/32; H03L 1/00; H03L 1/02; H03L 1/022; H03L 1/026–1/028; H03L 7/06; H03L 7/083; H03L 7/0991; H03L 7/104; H03L 7/143; H03L 7/145; H03L 7/146; H03L 7/24

USPC ............................. 331/10, 18, 154, 158, 176
See application file for complete search history.

(56) References Cited

U.S. PATENT DOCUMENTS

| | | | | |
|---|---|---|---|---|
| 5,604,468 | A | * | 2/1997 | Gillig ............................ 331/176 |
| 5,933,058 | A | * | 8/1999 | Pinto et al. ...................... 331/17 |
| 6,154,095 | A | * | 11/2000 | Shigemori et al. .............. 331/16 |
| 8,102,158 | B2 | * | 1/2012 | Sekine et al. .................. 320/166 |
| 2012/0218048 | A1 | * | 8/2012 | Akaike et al. ..................... 331/2 |
| 2013/0033332 | A1 | * | 2/2013 | Akaike et al. ................... 331/70 |
| 2013/0038397 | A1 | * | 2/2013 | Kobayashi ....................... 331/46 |

FOREIGN PATENT DOCUMENTS

| | | |
|---|---|---|
| JP | 2001-344039 | 12/2001 |
| JP | 2012-208804 | 10/2012 |
| JP | 2013-051677 | 3/2013 |

* cited by examiner

*Primary Examiner* — Levi Gannon
(74) *Attorney, Agent, or Firm* — Jianq Chyun IP Office

(57) ABSTRACT

An oscillator includes a voltage controlled oscillator, a PLL circuit, a crystal unit and an oscillator circuit configured to generate a clock, a digital control circuit, and a clock switching unit. The digital control circuit is configured to set an oscillation parameter of the oscillator circuit, and a parameter of the PLL circuit. The clock switching unit is configured to supply an output signal of the voltage controlled oscillator to the digital control circuit as a clock signal so as to cause the digital control circuit to operate using the clock signal when powered on, and configured to supply an output signal of the oscillator circuit to the digital control circuit as a clock signal after the digital control circuit sets the oscillation parameter of the oscillator circuit. An initial voltage is supplied to the voltage controlled oscillator as a control voltage when the oscillator is powered on.

8 Claims, 10 Drawing Sheets

OSCILLATOR

CROSS-REFERENCE TO RELATED APPLICATION

This application claims the priority benefit of Japanese application serial no. 2013-193051, filed Sep. 18, 2013. The entirety of the above-mentioned patent application is hereby incorporated by reference herein and made a part of specification.

BACKGROUND

1. Technical Field

The disclosure relates to an oscillator which includes a crystal unit and an oscillator circuit for generating a clock.

2. Description of the Related Art

Some oscillators may be configured as an oven controlled crystal oscillator (OCXO) 100 illustrated in FIG. 9. In the OCXO 100, a temperature in the oven is calculated using a difference between frequencies respectively output from two crystal units. Then, based on the calculated temperature, an output of a heater 46 is the corrected, and a frequency compensation value is changed, the frequency compensation value being output to a PLL circuit unit 41 from a temperature compensation frequency calculating unit 32 so as to reduce a frequency variation outputs of a voltage controlled crystal oscillator (VCXO) 43. The section of embodiments will describe the details of respective components in the OCXO 100, and then the section of the related art only outlines the respective components. Note that Japanese Unexamined Patent Application Publication No. 2013-51677 also discloses an OCXO with a configuration approximately similar to the disclosure.

In the OCXO 100, first oscillator circuits (OSC) 11, a second oscillator circuit 21, and a digital control circuit 33 or similar circuits are included in a common integrated circuit (LSI), which is a digital signal processing unit 3. The LSI uses an oscillation frequency of the first oscillator circuit 11 as a system clock. Incidentally, the oscillation characteristics of the crystal unit vary for each crystal unit. Then, an oscillator circuit causing a crystal unit to oscillate is configured to change oscillation parameters such that the oscillator circuit can cause respective crystal units to oscillate at a frequency within the predetermined range even if respective crystal units have such a variation in oscillation. The oscillation parameter is a circuit constant of the oscillator circuit, and the setting of the oscillation parameter determines a current value which flows through the oscillator circuit and a capacitance value and an inductor value of a capacitor which constitutes the oscillator circuit or a similar value.

The LSI of the OCXO 100 stores initial parameters, which are set at each component in the LSI when the OCXO 100 is powered to activate the LSI, the initial parameters including the oscillation parameter. Namely, the OCXO 100 preliminary determines the oscillation parameters to be set for the first oscillator circuit 11 when the OCXO 100 is powered, and the initial parameters will be standard oscillation parameters.

The description will continue with reference to a conceptual diagram of FIG. 10. A reference numeral A in the drawing indicates a frequency range of a clock of the LSI. The LSI can be activated by supplying a clock, which is in the frequency range A, when the OCXO 100 is powered. The activated LSI appropriately sets the parameters of the circuits which constitutes the LSI, which allows the OCXO 100 to output a signal with desired frequency. A reference numeral B in the drawing indicates a frequency range (changeable range) within which the LSI can cause the crystal unit to oscillate. The crystal unit which oscillates at frequencies within the changeable range B can change the oscillation parameters of the first oscillator circuit 11 from the standard oscillation parameters to other oscillation parameters so as to change its oscillation frequency to an oscillation frequency within the clock frequency range A.

When the standard oscillation parameter is set, the LSI of a crystal unit C which is illustrated in FIG. 10 receives an appropriate clock (clock in frequency range A) to oscillate at a frequency within the changeable range B and the clock frequency range A. Accordingly, the crystal unit C can be used as the first crystal unit 10.

A crystal unit D illustrated in FIG. 10 oscillates at a frequency within the changeable range B but not within the clock frequency range A. Here, if the LSI operates with being supplied with an appropriate clock, the LSI can change the standard oscillation parameters of the first oscillator circuit 11 to, for example, the oscillation parameters read out from outside of the LSI, and can cause the crystal unit D to oscillate at a frequency within the clock frequency range A. On the contrary, if the LSI does not operate because no clock is supplied, the LSI cannot change the oscillation parameters, which makes the crystal unit D useless as the first crystal unit 10.

A description will be given with particular examples, in which the clock frequency range A for the LSI is from 50 MHz to 90 MHz. Then, the first crystal unit 10 oscillates, with the standard oscillation parameter, at an oscillation frequency of 20 MHz. If the first crystal unit 10 can oscillate at a frequency of 60 MHz using a triple wave, the first crystal unit 10 can supply the appropriate clock to the LSI to activate the LSI. The standard oscillation parameter, however, is determined in advance, which makes it impossible for the first crystal unit 10 to oscillate at such a frequency of 60 MHz.

In order to address the above-described situation, the OCXO 100 may be configured with the first crystal unit 10 which can oscillate at either frequency of 20 MHz and 60 MHz when the OCXO 100 is powered. In particular, for example, an external circuit is provided at the outside of the LSI via which the crystal unit is connected to the oscillator circuit, the external circuit adjusting the capacitance component and the inductor component between the crystal unit and the oscillator circuit. This, however, results in a large circuit size. One option is developing a new LSI which can oscillate at 20 MHz and 60 MHz. This, however, requires large cost.

The above described is a case in which an output of the first oscillator circuit 11 is used as a system clock of the LSI. The similar problem arises when an output of the second oscillator circuit 21 is used as a system clock. In other word, the crystal units are required to be selected as the first crystal unit 10 or as the second crystal unit 20 such that the crystal units can oscillate at a frequency within frequency range of the system clock of the LSI, therefore the available types and combinations of the crystal units are unfortunately limited. Japanese Unexamined Patent Application Publication No. 2001-344039 and Japanese Unexamined Patent Application Publication No. 2012-208804 disclose techniques that switch clocks of the systems, but they do not disclose the above-described problems.

The disclosure has been made in view of such circumstances, and an aim thereof is to provide a technique which increases selectable types and combinations of crystal units used in an oscillator which includes a crystal unit and an oscillator circuit for generating a clock.

SUMMARY

An oscillator according to this disclosure includes a voltage controlled oscillator, a PLL circuit, a crystal unit and an oscillator circuit configured to generate a clock, a digital control circuit, and a clock switching unit. The PLL circuit includes digital circuits including a reference signal generating unit, and a circuit unit configured to extract a signal corresponding to a phase difference between a signal corresponding to an output signal of the voltage controlled oscillator and a reference signal of the reference signal generating unit. The digital control circuit is configured to set an oscillation parameter of the oscillator circuit, and a parameter of the PLL circuit. The clock switching unit is configured to supply an output signal of the voltage controlled oscillator to the digital control circuit as a clock signal so as to cause the digital control circuit to operate using the clock signal when powered on, and configured to supply an output signal of the oscillator circuit to the digital control circuit as a clock signal after the digital control circuit sets the oscillation parameter of the oscillator circuit. An initial voltage is supplied to the voltage controlled oscillator as a control voltage when the oscillator is powered on.

The oscillator according to the disclosure includes the clock switching unit configured to supply an output signal of the voltage controlled oscillator, to which the initial voltage is supplied as a control voltage, to the digital control circuit as a clock signal when the oscillator is powered, and configured to supply an output signal of the oscillator circuit to the digital control circuit as a clock signal after the digital control circuit operates to set the oscillation parameters of the oscillator circuit. Accordingly, for a crystal unit which oscillates using an oscillator circuit, it is not required to use a crystal unit which oscillates a clock signal which is supplied to the digital control circuit when the oscillator is powered. Consequently, this increases selectable types of crystal units.

DETAILED DESCRIPTION

Figure 1:
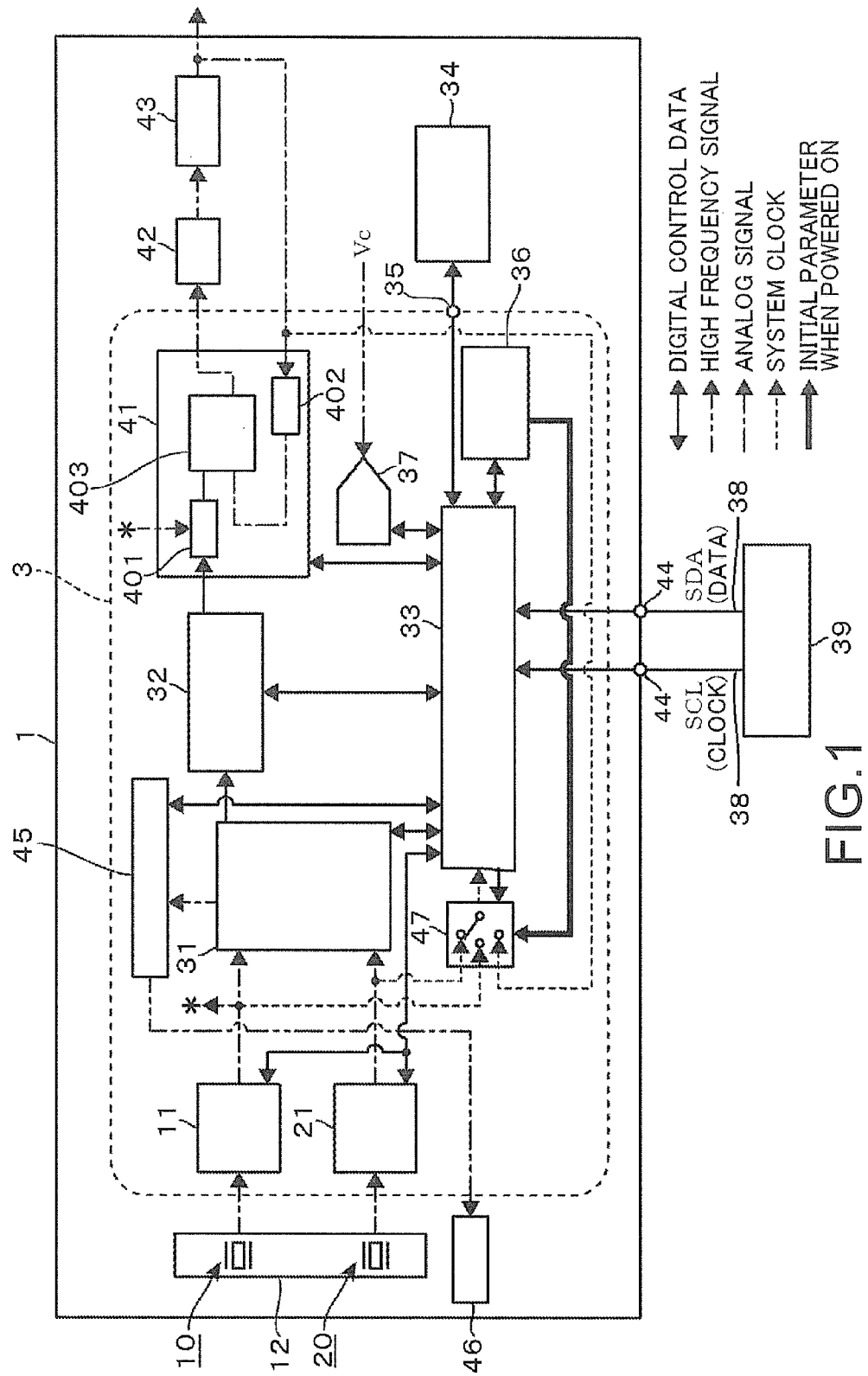
FIG. 1 is a block diagram illustrating an OCXO according to the disclosure.
Figure 10:
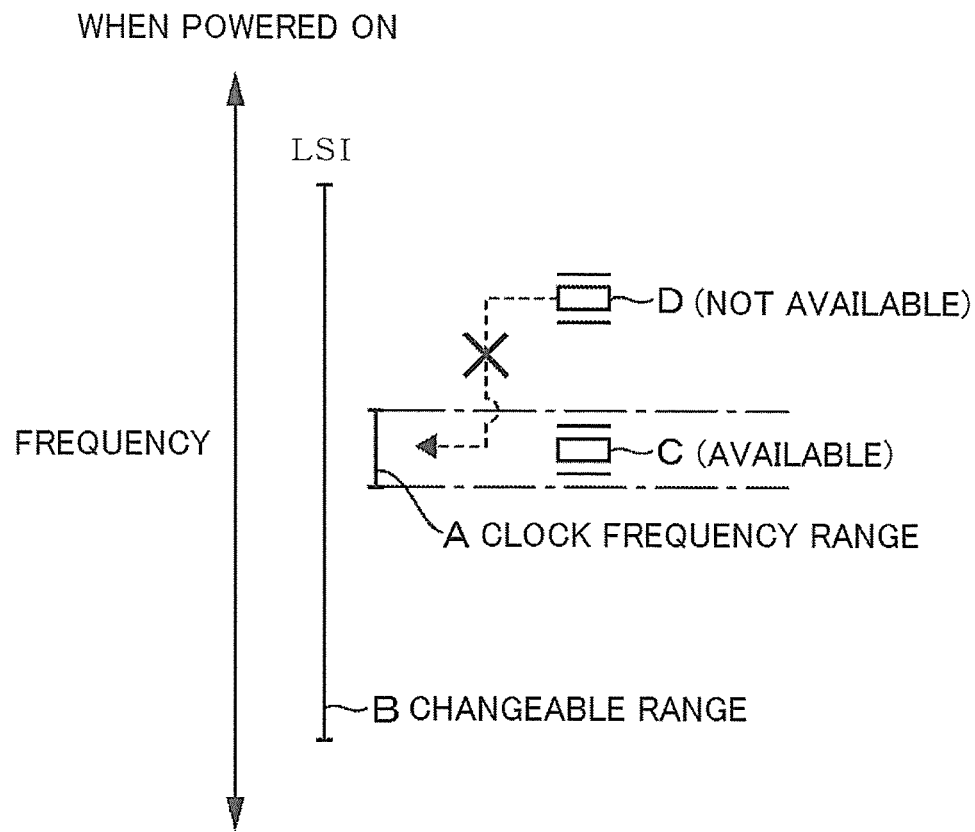
FIG. 10 is an explanatory drawing illustrating a relation between an oscillation frequency of crystal units which constitute the OCXO and a clock frequency range.

The following description describes an OCXO 1, which is an embodiment of an oscillator according to the disclosure. FIG. 1 illustrates a block diagram of the OCXO 1. In the block diagram, thin solid line arrows indicate flows of digital control data signals when registers in respective circuits are set, read out, and written, in the OCXO 1. One-dot chain line arrows indicate flow directions of high frequency signals, and two-dot chain line arrows indicate flow directions of analog signals. Further, dotted line arrows indicate flow directions of system clock signals. Also, thick solid line arrow indicates a flow of a switching signal for a switch, the switching signal being one of the initial parameters set when the oscillator 1 is powered. Note that the respective arrows similar to those used in the OCXO 1 of FIG. 1 indicate respective signal flows in the OCXO 100 of FIG. 10, which is described in the section of the related art. However, the OCXO 100 does not transmit data corresponding to a switching signal; accordingly the thick solid line arrow is not illustrated in FIG. 10.

The OCXO 1 includes a first crystal unit 10 and a second crystal unit 20, which respectively include AT-cut crystal elements and excitation electrodes. In this example, the first crystal unit 10 and the second crystal unit 20 are housed in a common case 12 with being close to each other such that they are placed at equal ambient temperature. The first crystal unit 10 is connected to a first oscillator circuit 11 disposed outside of the case 12. Similarly, the second crystal unit 20 is connected to the second oscillator circuit 21 disposed outside of the case 12.

At the subsequent stage side of the first oscillator circuit 11, which is connected to the first crystal unit 10, and the second oscillator circuit 21, which is connected to the second crystal unit 20, a frequency counter 31, a temperature compensation frequency calculating unit 32, the PLL circuit unit 41, a low-pass filter (LPF) 42, and the voltage controlled crystal oscillator (VCXO) 43 are connected. The PLL circuit unit 41, which is a digital circuit, includes a direct digital synthesizer (DDS) circuit unit 401, which is a reference signal generating unit, a divider 402, and a phase comparison unit 403. A reference signal is generated based on a saw-tooth wave which is output from the DDS circuit unit 401, then a phase of the reference signal is compared with a phase of a signal obtained by dividing an output signal of the VCXO 43 by phase comparison unit, and a comparison result is output to the LPF 42. An output signal of the VCXO 43 is controlled by the output signal of the LPF 42. Namely, the PLL circuit unit 41 includes the phase comparison unit 403 and the divider 402, which are part of the phase locked loop (PLL), and then the PLL is formed by the phase comparison unit 403, the divider 402, the LPF 42, and the VCXO 43.

The DDS circuit unit 401 uses a frequency signal output from the first oscillator circuit 11 as a clock, and receives a control voltage for outputting a saw-tooth wave signal having a target frequency. However, a frequency of the clock signal has a temperature characteristic. Thus, in order to cancel the temperature characteristic, a control voltage, which is input to the DDS circuit unit 401 is corrected by adding a signal corresponding to a frequency compensation value from a temperature compensation frequency calculating unit 32 (described below). Accordingly, an output signal of the DDS circuit unit 401 goes through a temperature compensation process to be stabilized. Incidentally, operation of the PLL circuit unit 41 which includes the DDS circuit unit 401 requires a clock signal whose frequency is higher than that of oscillation output from the VCXO 43. For this reason, the VCXO 43 works as a clock supplier for the LSI when the OCXO 1 is powered, and then the first oscillator circuit 11 subsequently works as a clock supplier for the LSI, as described below.

A value corresponding to a frequency difference ΔF between the oscillation output f1 of the first oscillator circuit 11 and the oscillation output f2 of the second oscillator circuit 21 corresponds to a temperature of atmosphere where the crystal units 10 and 20 are placed, and this value is referred to as a temperature detection value. Note that, for convenience of explanation, the oscillation outputs f1 and f2 also respectively represent the oscillation frequencies of the first oscillator circuit 11 and the second oscillator circuit 21. In this example, the frequency counter 31 extracts a value of $\{(f2-f1)/f1\}-\{(f2r-f1r)/f1r\}$, which corresponds to the temperature detection value which is proportional to the temperature. The values f1r and f2r are respectively the oscillation frequency of the first oscillator circuit 11 and the oscillation frequency of the second oscillator circuit 21 at a reference temperature, for example, 25° C.

The temperature compensation frequency calculating unit 32 calculates a frequency compensation value based on a relation between a detection result of a temperature and a pre-established frequency compensation value, and adds the frequency compensation value to the predetermined frequency setting value to set the frequency setting signal. The frequency setting value and the relation between the temperature detection value and the frequency compensation value are stored in the digital control circuit 33. The frequency compensation value is a value for compensating a variation when the temperature of the first crystal unit 10 varies from a target temperature, that is, a variation in temperature of the clock signal.

For example, assuming $(f2-f2r)/f2r=OSC2$, and $(f1-f1r)/f1r=OSC1$, a relation between (OSC2−OSC1) and a temperature is obtained through actual measurement during manufacturing the crystal units, then a curve of a compensation frequency is derived from the actual measurement data, the compensation frequency being a frequency for cancelling a frequency variation amount with respect to temperature, and the coefficients of the ninth-order polynomial approximate expression are derived through a least squares method. Then, the coefficients of the polynomial approximate expression are previously stored in the digital control circuit 33, and the temperature compensation frequency calculating unit 32 calculates a compensation value using these coefficients of the polynomial approximate expression. Consequently, this stabilizes a frequency of a clock with respect to a temperature variation, which results in a stabilized output frequency of the VCXO 43. That is, the OCXO 1 is also configured as a temperature compensated crystal oscillator (TCXO). So to speak, the OCXO 1 is configured as an apparatus with dual temperature control which can stabilize its output with high accuracy.

In the drawing, a reference numeral 34 denotes an external memory including an electrically erasable programmable read only memory (EEPROM). A reference numeral 35 denotes a connecting terminal which connects the external memory 34 to the digital signal processing unit 3 (described below). The external memory 34 stores various data such as the coefficients of the polynomial approximate expression and the frequency setting value, oscillation parameters of the first oscillator circuit 11 and the second oscillator circuit 21, and post-activation switching parameters. The coefficients of the polynomial approximate expression and the frequency setting value are used by the temperature compensation frequency calculating unit 32, and the post-activation switching parameter is a parameter for switching a switch 47 for a while when the OCXO 1 powered.

In the drawing, a reference numeral 36 denotes an internal memory including a one-time programmable read only memory (OTPROM). The internal memory 36 stores the initial parameters for respective components which are parts of the digital signal processing unit 3, the initial parameters including the standard oscillation parameters respectively set for the oscillator circuits 11 and 21 (described above). In addition, the internal memory 36 stores the activation switching parameters which control switching operation of the switch 47 when the OCXO 1 is powered.

In the drawing, a reference numeral 37 denotes an analog-digital converter which converts an analog DC voltage signal Vc, which is sent to the digital signal processing unit 3, into a digital DC voltage. In the drawing, a reference numeral 38 denote connections which connect the digital control circuit 33 to an interface circuit of an external computer 39 via inter-integrated circuit ($I^2C$) buses. In the drawing, reference numerals 44 denote terminals which respectively connect the digital control circuit 33 to the external computer 39. The external computer 39 allows a user of the OCXO 1 to change respective fragments of data in registers which is included in the digital control circuit 33. For example, a user can change the predetermined frequency setting value for changing the output frequency of the OCXO 1.

The OCXO 1 includes a heater control circuit 45 which controls a temperature thereof based on the detected temperature so as to maintain a setting temperature in the atmosphere where the crystal units 10 and 20 are placed. The heater control circuit 45 supplies an electric power to the heater 46 in response to the temperature detection value (digital value), which is output from the frequency counter 31, and the pre-determined temperature setting value, which is output from the digital control circuit 33. The greater electric power the heater control circuit 45 supplies, the more amount of heat the heater 46 generates, which compensates a temperature of the atmosphere in the case 12 which houses the crystal units 10 and 20 so as to maintain the temperature at, for example, the zero-temperature coefficient (ZTC) point of the first crystal unit 10. The ZTC point is an inflection point of a graph illustrating the oscillation frequency of the crystal unit with setting the variation of the oscillation frequency at the reference temperature as the vertical axis, and with setting the temperature change as the horizontal axis.

The following description describes the switch 47, which is a clock switching unit. The switch 47 is configured to switch among the output of the first oscillator circuit 11, the output of the second oscillator circuit 21, and the output of the VCXO 43 to supply the switched output to a clock input port (not illustrated) of the digital control circuit 33 with switching operation. As described above, the switching operation of the switch 47 is controlled by during activation switching parameters when the OCXO 1 is powered, the during activation switching parameters being stored in the internal memory 36, then the switching operation of the switch 47 is subsequently controlled by the post-activation switching parameters, which is sent from the external memory 34 to digital control circuit 33. Here, the respective switching parameters are configured to cause the switch 47 to connect the digital control circuit 33 and the VCXO 43 when the OCXO 1 is powered, then to connect the digital control circuit 33 and the first oscillator circuit 11.

The above-described oscillator circuits 11 and 21, frequency counter 31, temperature compensation frequency calculating unit 32, PLL circuit unit 41, heater control circuit 45, digital control circuit 33, analog-digital converter 37, internal memory 36 and switch 47 are disposed in the digital signal processing unit 3, which is a common integrated circuit. Also, the digital signal processing unit 3, the case 12 housing the crystal units 10 and 20, the LPF 42, the VCXO 43 and the heater 46 are disposed in an oven, in which the temperature is controlled by the heater 46.

The VCXO 43 is disposed at outside of the LSI. The appropriate parameters such as a dividing rate N (N is an integer) are not set for the PLL circuit unit 41 by the digital control circuit 33 when the OCXO 1 is powered. Also, the PLL does not lock the signal since a clock is not supplied to the PLL circuit unit 41. However, even the PLL does not lock the signal, turning on the power source supplies an initial voltage to the VCXO 43 as a control voltage, which operates the VCXO 43, and then an oscillation output is obtained from the VCXO 43 oscillation output.

Figure 2:
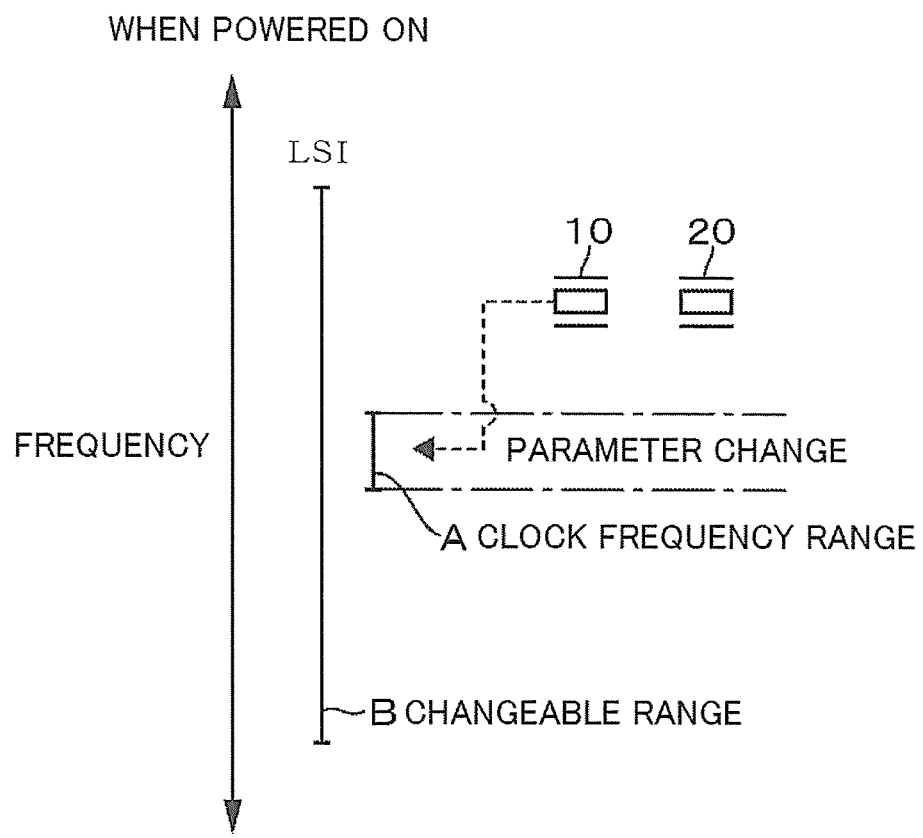
FIG. 2 is an explanatory drawing illustrating a relation between an oscillation frequency of crystal units which constitute the OCXO and a clock frequency range.

For example, as illustrated in FIG. 2, the first crystal unit 10 and the second crystal unit 20 in the OCXO 1 oscillate at frequencies which are out of the clock frequency range A of the LSI (digital signal processing unit 3) when the above-described standard oscillation parameters are set for the oscillator circuits 11 and 21. Then, the oscillation parameter of the first oscillator circuit 11 is changed, which allows the first crystal unit 10 to oscillate at a frequency within the clock frequency range A. Then, the VCXO 43 is configured to be able to oscillate at a frequency within the clock frequency range A when the power source is powered.

Figure 3:
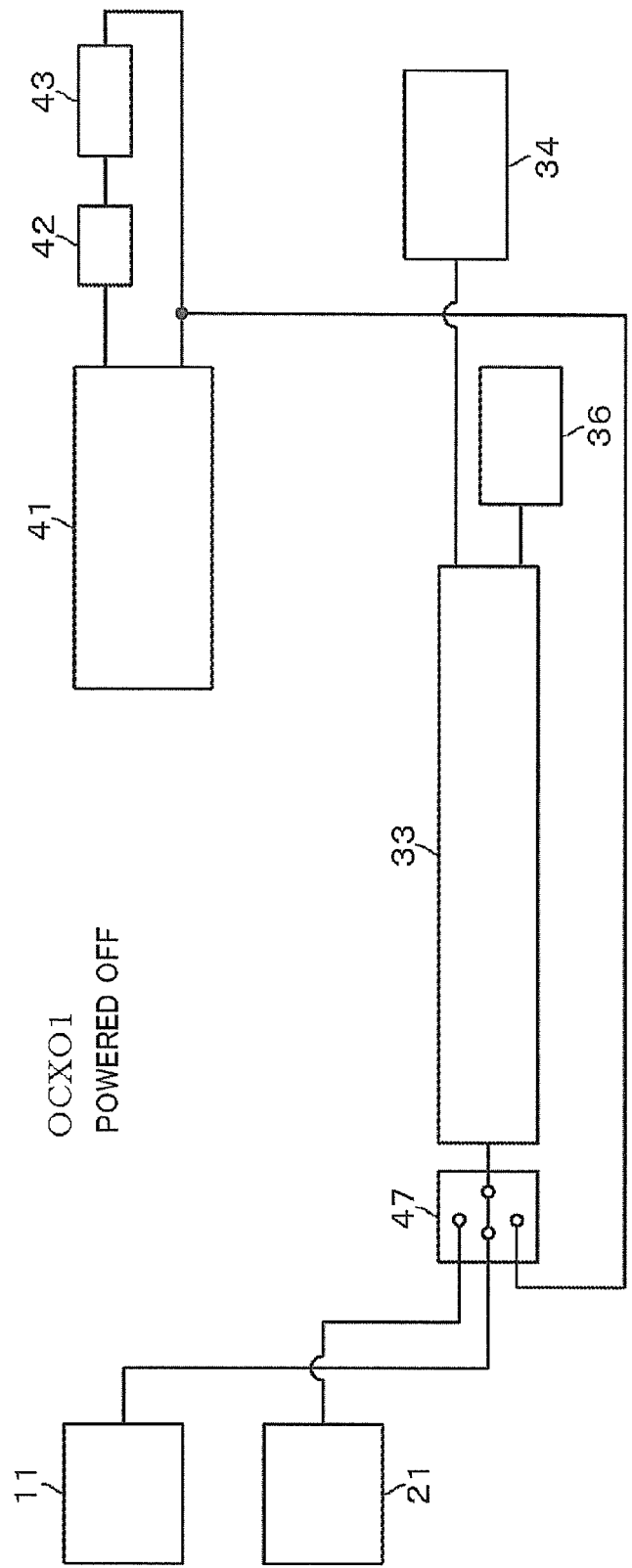
FIG. 3 is an explanatory drawing illustrating transmission and reception of signals in the OCXO.
Figure 8:
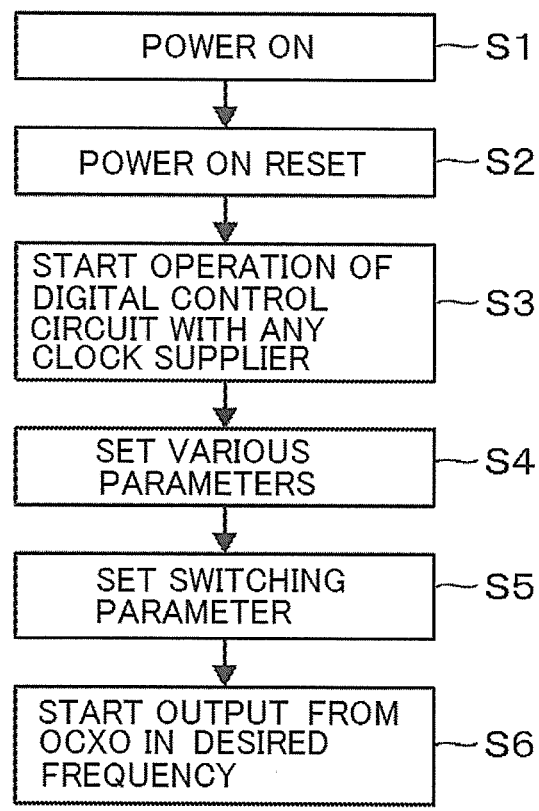
FIG. 8 is a flowchart illustrating processes from when the OCXO is powered on until the OCXO starts to oscillate at a predetermined frequency.
Figure 9:
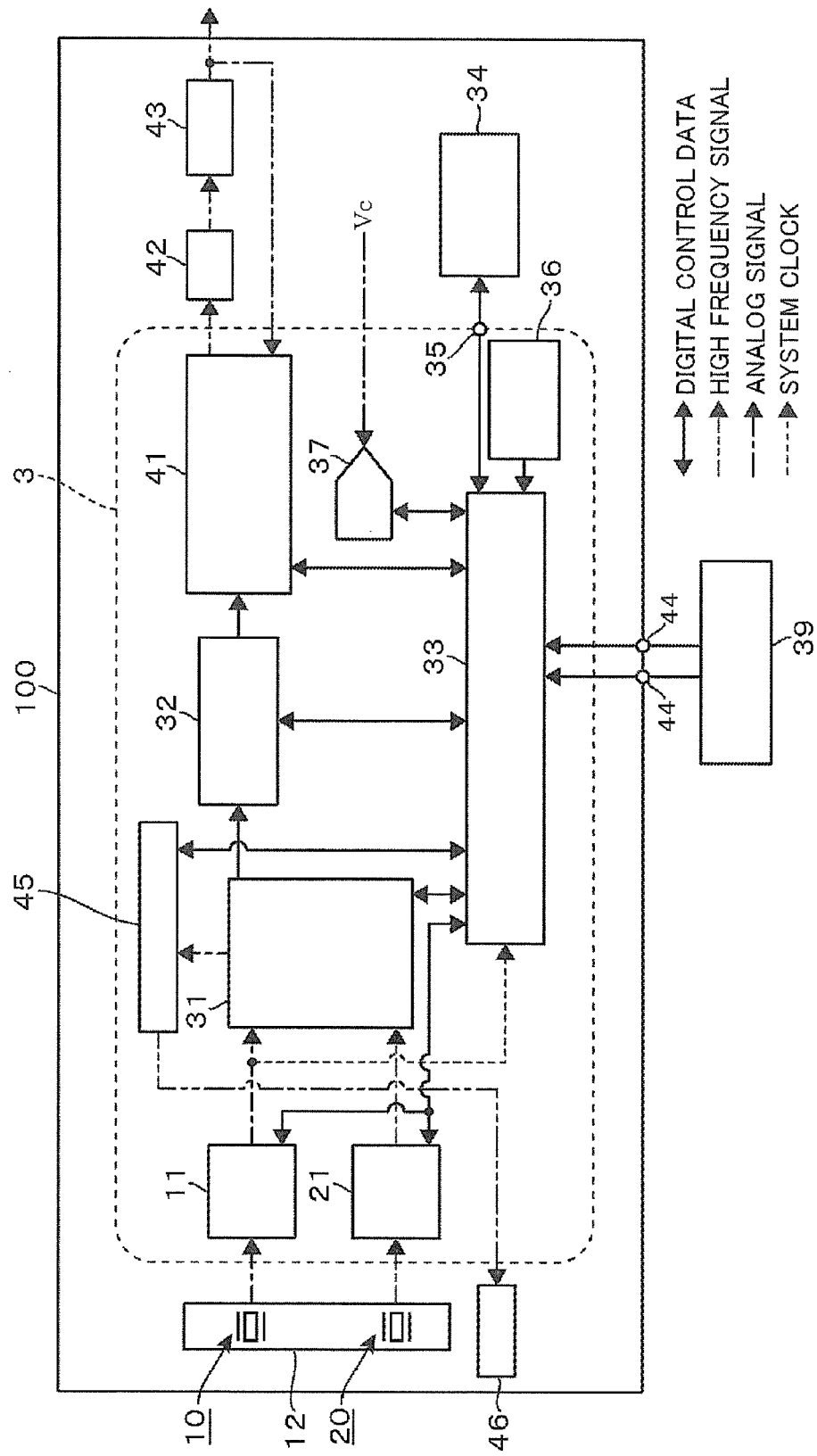
FIG. 9 is a block diagram of a conventional OCXO.

The following description describes a procedure from when the OCXO 1 is powered to when the OCXO 1 starts to oscillate with the predetermined output with reference to FIG. 3 to FIG. 7, which illustrate transmit and reception of signals, and FIG. 8, which is a flow chart. FIG. 3 illustrates the OCXO 1 with being powered off. At this point, the digital control circuit 33 is connected to the first oscillator circuit 11 by the switch 47.

Figure 4:
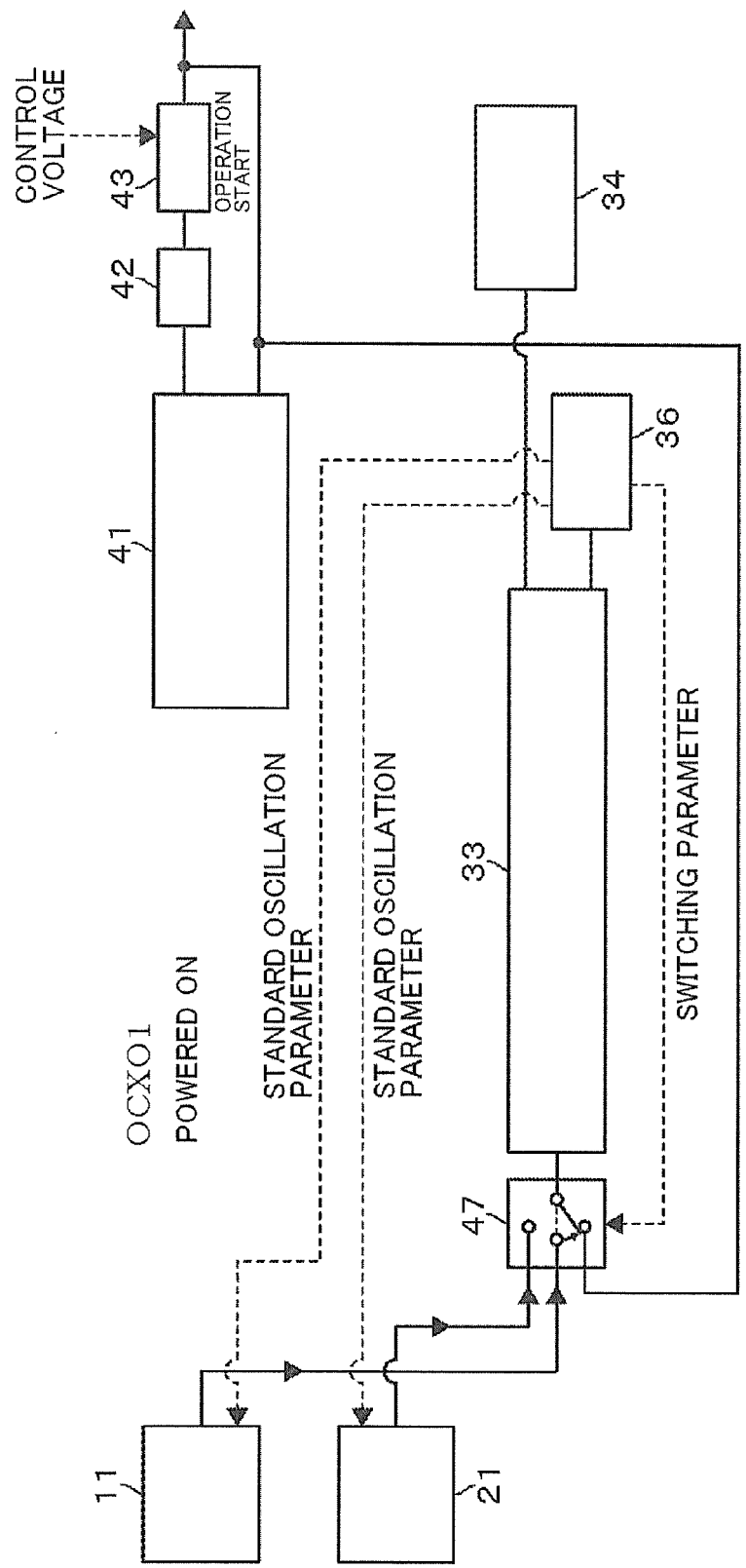
FIG. 4 is an explanatory drawing illustrating transmission and reception of signals in the OCXO.
Figure 5:
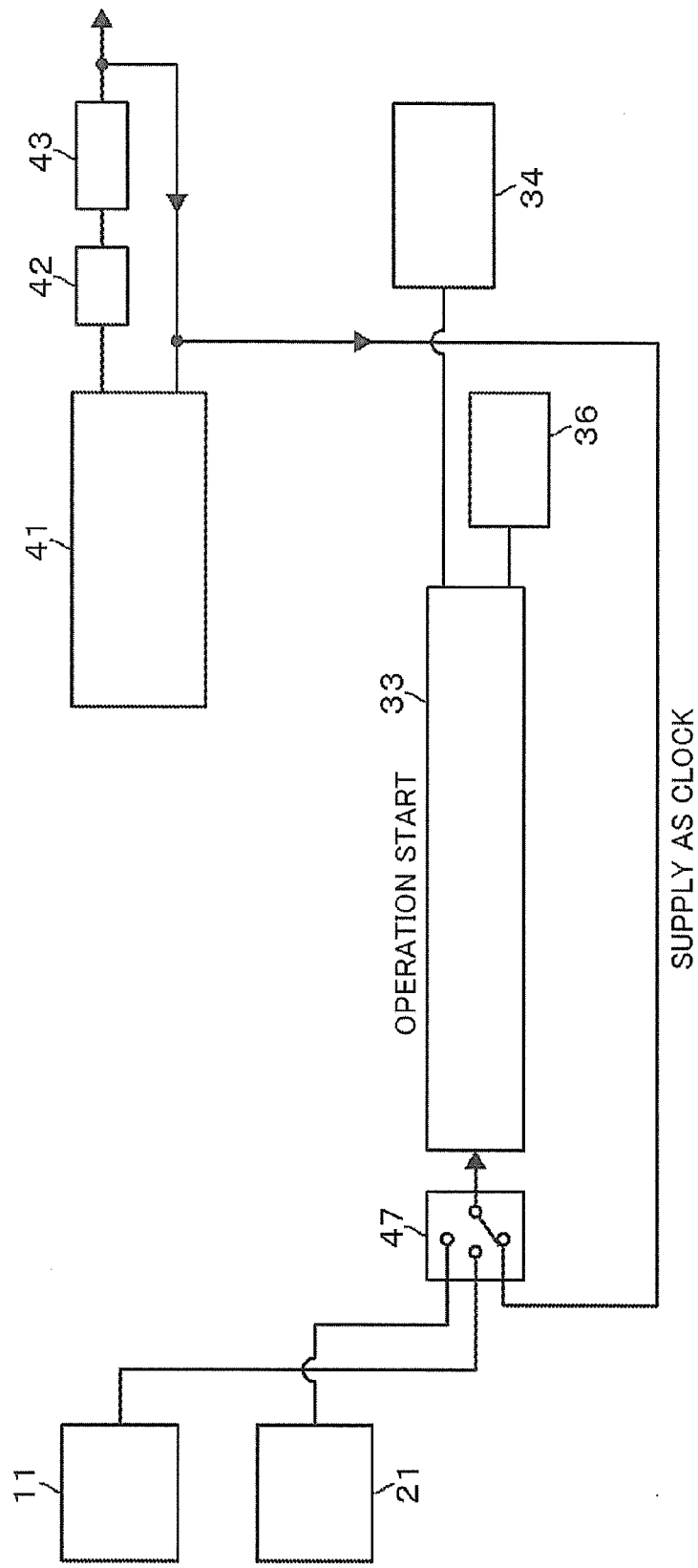
FIG. 5 is an explanatory drawing illustrating transmission and reception of signals in the OCXO.

When the OCXO is powered (step S1), data of the register in the digital control circuit 33 is reset, in other words, a power on reset is performed (step S2). With resetting the data, the switch 47 switches the connecting destination of the digital control circuit 33 from the first oscillator circuit 11 to the VCXO 43 based on the during activation switching parameters which are stored in the internal memory 36 (FIG. 4). Also, the standard oscillation parameters stored in the internal memory 36 are respectively set for the first oscillator circuit 11 and the second oscillator circuit 21, which causes the first oscillator circuit 11 and the second oscillator circuit 21 to output, for example, unstable oscillation outputs. As described above, the standard oscillation parameters are not appropriate for the crystal units 10 and 20, therefore the crystal units 10 and 20 outputs oscillation outputs different from the desired oscillation outputs f1 and f2.

Powering the OCXO causes oscillation of the VCXO 43, and this oscillation output is supplied to the digital control circuit 33 as a clock (FIG. 5) to activate the digital control circuit 33 (step S3). The activated digital control circuit 33 reads out the various parameters stored in the external memory 34, and store them in the registers of the digital control circuit 33. These parameters include the oscillation parameters of the oscillator circuits 11 and 21. There are more than one oscillation parameters, then the digital control circuit 33 switches these oscillation parameters to set the oscillator circuits 11 and 21, and determines the appropriate oscillation parameter for outputting the desired oscillation output. Then the oscillator circuits 11 and 21 respectively operate with the determined oscillation parameter. This makes the oscillation outputs from the oscillator circuits 11 and 21, for example, stable overtones, and the oscillation output of the first oscillator circuit 11 has a frequency within the clock frequency range described in FIG. 2.

Figure 6:
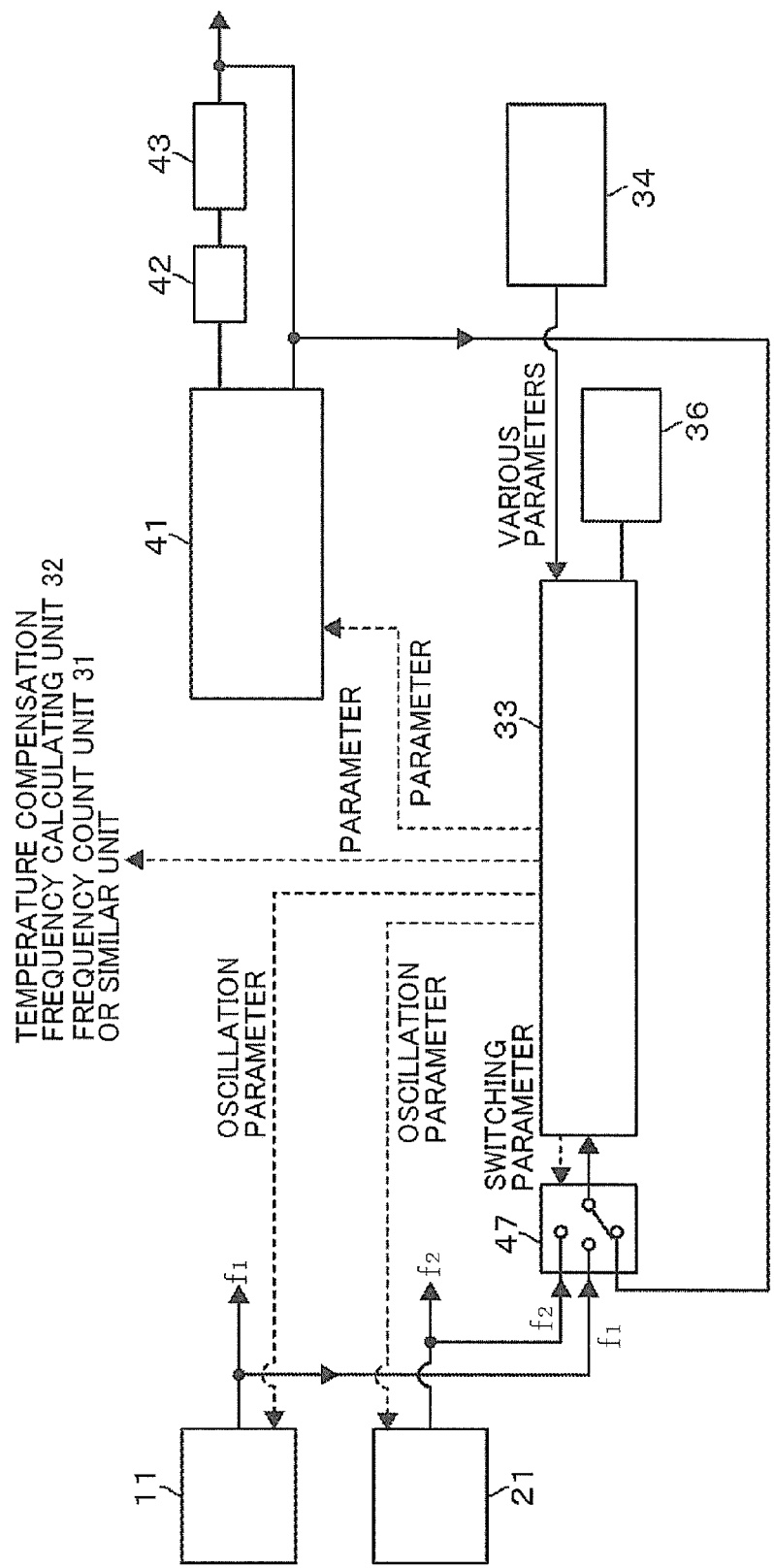
FIG. 6 is an explanatory drawing illustrating transmission and reception of signals in the OCXO.
Figure 7:
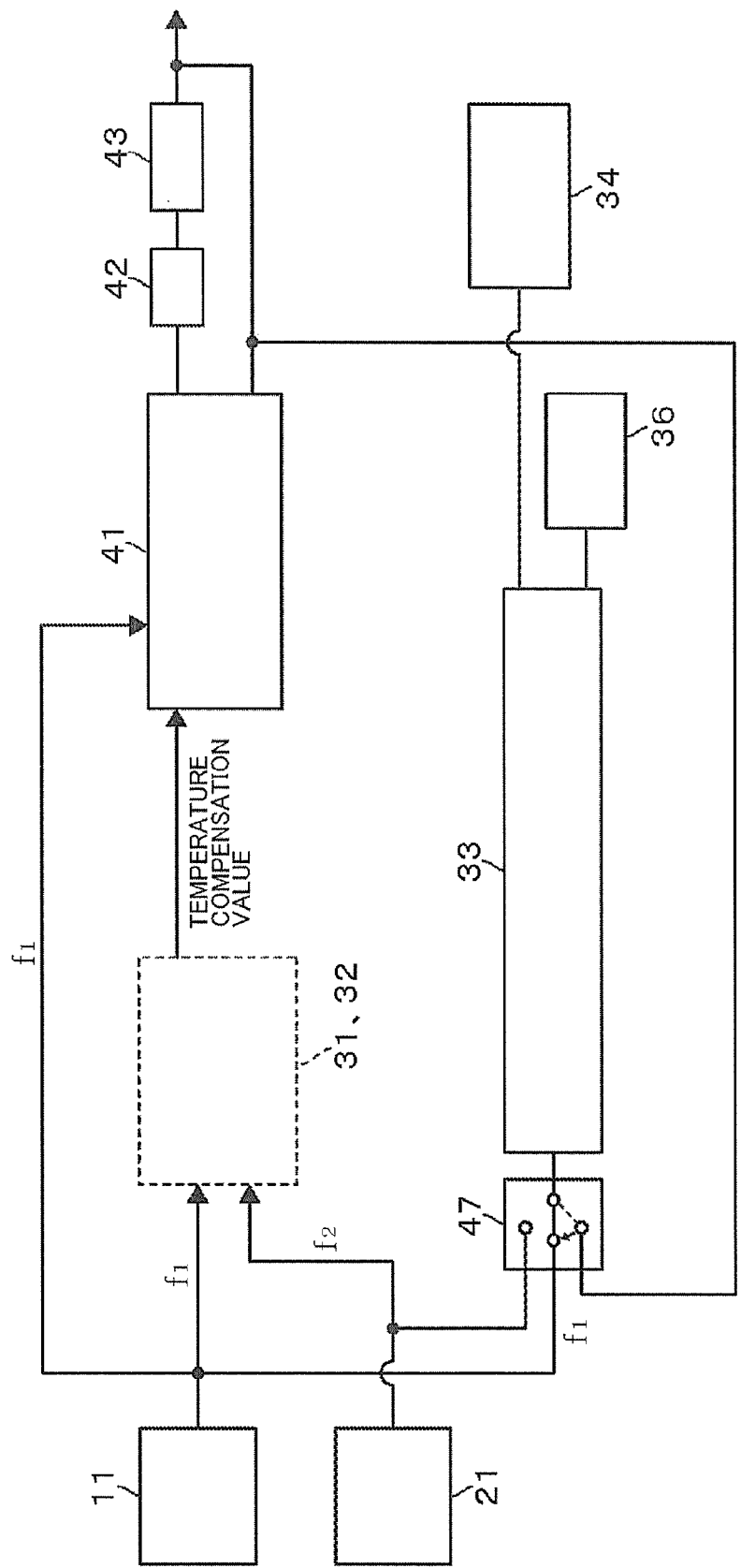
FIG. 7 is an explanatory drawing illustrating transmission and reception of signals in the OCXO.

The parameters read out from the external memory 34 are output to set the respective components in the digital signal processing unit 3 other than the oscillator circuits 11 and 21 (step S4 and FIG. 6). Examples of the parameters include the oscillation frequencies f1 r and f2r in each reference temperature, the coefficients of the polynomial approximate expression, the frequency setting value, and the parameters of the PLL circuit unit 41, which are described above. The parameters of the PLL circuit unit 41 include the dividing rate N of the divider 402. These parameters further include the above-described post-activation switching parameters. After reading the post-activation switching parameters, the digital control circuit 33 switches the switch 47 based on the post-activation switching parameters such that the digital control circuit 33 is connected to the first oscillator circuit 11 (step S5 and FIG. 7).

Then, the output f1 of the first oscillator circuit 11 is supplied to the digital control circuit 33 as a clock, the digital control circuit 33 continues to operate. Also, the switching operation of the switch 47 supplies the output f1 of the first oscillator circuit 11 to the other respective circuits of the digital signal processing unit 3 such as the PLL circuit unit 41.

The output frequency f1 of the first oscillator circuit 11 is higher than the output frequency of the VCXO 43, then supplying such a clock signal operates the PLL circuit unit 41. Then, the frequency counter 31 calculates the temperature detection value of $\{(f2-f1)/f1\} - \{(f2r-f1r)/f1r\}$ based on the output f1 of the first oscillator circuit 11 and the output f2 of the second oscillator circuit 21. The heater control circuit 45 controls power feeding of the heater 46 based on the temperature detection value, which makes a temperature in the oven constant so as to maintain the temperature around the first crystal unit 10 at the ZTC point. Further, the compensation calculation value which is output to the PLL circuit unit 41 is controlled based on the temperature detection value.

As described above, supplying relatively high clock signal causes the PLL circuit unit 41 to generate a pulse signal based on the output of the VCXO 43, and a frequency setting signal which is calculated based on the temperature detection value. The pulse signal is integrated at the above-described LPF 42, and then the output of the VCXO 43 is controlled based on the integrated signal.

Also, as described above, the heater 46 controls a temperature in the oven to stabilize the output of the first oscillator circuit 11, which stabilizes the clock to be supplied to the PLL circuit unit 41. The PLL circuit unit 41 controls the VCXO 43, which outputs a signal with a stable frequency (step S6).

The above-described OCXO 1 is configured to activate the digital signal processing unit 3 with connecting the VCXO 43, as a system clock supplier, which can oscillate at a frequency within the frequency range A of the clock signal of the LSI to the digital signal processing unit 3 via the switch 47 when the OCXO 1 is powered, and then the digital signal processing unit 3 can change the oscillation parameters of the first oscillator circuit 11 and the second oscillator circuit 21. Then, after the digital signal processing unit 3 has changed the oscillation parameters, the switch 47 switches connecting destination of the digital signal processing unit 3 to the first oscillator circuit 11, as a clock signal supplier, then causes the first oscillator circuit 11 to supply the oscillation output f1 to the signal processing unit 3 to control the operation of the digital signal processing unit 3. Accordingly, a crystal unit which oscillates with the standard oscillation parameters, which are preliminary stored in the OCXO 1, is not required to be used as the first crystal unit 10 or the second crystal unit 20 when the OCXO 1 is powered, which increases selectable types of the crystal units. In addition, such increase in selectable types of the crystal units eliminates a need for designing the external circuit, which is described in the section of the related art, for each crystal unit. Consequently, this successfully reduces cumbersome tasks in the fabrication of the OCXO 1.

In addition, the above-described LSI of the OCXO 1 has an increased storage region, where a switching parameter for the switch 47 is stored, with respect to the internal memory 36 of the LSI of the OCXO 100. However, a capacity of the increased storage region is, for example, several bits for storing the switching operation parameters. That is, the OCXO 1 may advantageously has only a small scale circuit configuration and a small capacity of storage region compared with a configuration in which the LSI stores various oscillation parameters for operating the first oscillator circuit 11 when the OCXO 1 is powered, then the LSI switches the stored parameters to set the OSC1.

In the above-described example, although the digital signal processing unit 3 is, first connected to the VCXO 43 as a clock signal supplier then is switched to be connected to first oscillator circuit 11 as a clock signal supplier by the switch 47, the switching parameters stored in the external memory 34 may be set such that the digital signal processing unit 3 is switched to be connected to the second oscillator circuit 21 as a clock signal supplier instead of the first oscillator circuit 11 by the switch 47.

In the above-described example, although the second crystal unit 20 and the second oscillator circuit 21 work as a temperature sensor for detecting the ambient temperature of the first crystal unit 10 with high accuracy, a thermistor or similar sensor may be disposed as a temperature sensor instead of the second crystal unit 20 and the second oscillator circuit 21. In addition, the oscillator of the disclosure may be an oscillator having a configuration without controlling a temperature in the oven by the heater 46, which is a temperature compensated crystal oscillator (TCXO).

What is claimed is:

1. An oscillator comprising:
   a voltage controlled oscillator;
   a PLL circuit that includes digital circuits including a reference signal generating unit, and a circuit unit configured to extract a signal corresponding to a phase difference between a signal corresponding to an output signal of the voltage controlled oscillator and a reference signal of the reference signal generating unit;
   a crystal unit and an oscillator circuit configured to generate a clock;
   a digital control circuit configured to set an oscillation parameter of the oscillator circuit, and a parameter of the PLL circuit; and
   a clock switching unit configured to supply an output signal of the voltage controlled oscillator to the digital control circuit as a clock signal so as to cause the digital control circuit to operate using the clock signal when powered on, and configured to supply an output signal of the oscillator circuit to the digital control circuit as a clock signal after the digital control circuit sets the oscillation parameter of the oscillator circuit, wherein
   an initial voltage is supplied to the voltage controlled oscillator as a control voltage when the oscillator is powered on.

2. The oscillator according to claim 1, wherein
   the clock switching unit includes:
   a switching circuit configured to switch between an output signal of the voltage controlled oscillator and an output signal of the oscillator circuit to input the switched output signal to a clock input port of the digital control circuit; and
   a memory stores the output side of the voltage controlled oscillator as an initial value of the switching destination of the switching circuit, the initial value being read out to set the switching destination of the switching circuit when the oscillator is powered on.

3. The oscillator according to claim 2, further comprising:
   a memory storing a parameter for the switching circuit to switch to the connection where the oscillator circuit connects to the digital control circuit after the oscillation parameter of the oscillator circuit is set, wherein
   the digital control circuit is configured to cause the switching circuit to operate based on the parameter.

4. The oscillator according to claim 1, wherein
   assuming that the crystal unit and the oscillator circuit for generating a clock signal are respectively a first crystal unit and a first oscillator circuit,
   an output of the reference signal generating unit is temperature-compensated based on an output of the first oscillator circuit and an output of a second oscillator circuit,
   the output of the second oscillator circuit causing a second crystal unit to oscillate.

5. The oscillator according to claim 4, wherein
   the outputs of the first oscillator circuit and the second oscillator circuit are overtones.

6. The oscillator according to claim 4, further comprising:
   a frequency count unit configured to output a signal for outputting a reference signal to the reference signal generating unit based on outputs f1r and f2r of the first oscillator circuit and the second oscillator circuit at a reference temperature, and outputs f1 and f2 of the first oscillator circuit and the second oscillator circuit, wherein
   the digital control circuit is configured to set the f1r and f2r to the frequency count unit as parameters.

7. The oscillator according to claim 1, wherein
   the parameter of the PLL circuit includes a dividing rate to divide the output of the voltage controlled oscillator, and
   the circuit unit is configured to extract a signal corresponding to a phase difference between the divided signal and the reference signal of the reference signal generating unit.

8. The oscillator according to claim 1, wherein
   an oscillation frequency of the oscillator circuit for which the oscillation parameter is set is higher than an oscillation frequency of the voltage controlled oscillator.

* * * * *